United States Patent
Kaneda et al.

(10) Patent No.: US 6,562,250 B1
(45) Date of Patent: May 13, 2003

(54) METHOD FOR MANUFACTURING WIRING CIRCUIT BOARDS WITH BUMPS AND METHOD FOR FORMING BUMPS

(75) Inventors: Yutaka Kaneda, Kanuma (JP); Keiichi Naito, Kanuma (JP); Toshihiro Shinohara, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/697,453

(22) Filed: Oct. 27, 2000

(30) Foreign Application Priority Data

Nov. 10, 1999 (JP) ............................. 11-319669

(51) Int. Cl.$^7$ ..................... H01B 13/22; B44C 1/22
(52) U.S. Cl. ................. 216/13; 174/250; 174/254; 174/256
(58) Field of Search .................... 216/13, 20; 174/250, 174/254, 256

(56) References Cited

U.S. PATENT DOCUMENTS 5,759,417 A * 6/1998 Inaba ........................ 216/18
6,222,136 B1 * 4/2001 Appelt et al. ............... 174/254
6,365,499 B1 * 4/2002 Nakamura et al. ........... 29/840
2002/0038721 A1 * 9/2001 Kaneda ...................... 174/250

* cited by examiner

Primary Examiner—Robert Kunemund
Assistant Examiner—Shamim Ahmed
(74) Attorney, Agent, or Firm—Oliff & Berridge, PLC

(57) ABSTRACT

Wiring circuit boards with bumps can be manufactured such that stable bump connections are possible and plating pretreatments or other difficult operations are rendered unnecessary. By utilizing a technique whereby a bump-formation etching mask 7 is formed on a bump-forming surface 3a of a metal foil 3 which has a thickness that is the sum of the thickness t1 of the wiring circuit 1 and the height t2 of the bumps 2 which are to be formed on the wiring circuit 1 (t1+t2), and then the bumps 2 are formed by half-etching the metal foil 3 to a depth corresponding to the desired bump height t2 from the bump-formation etching mask 7 side, wiring circuit boards with bumps can be manufactured such that stable bump connections are possible and plating pretreatments or other complex processes are rendered unnecessary.

3 Claims, 3 Drawing Sheets

METHOD FOR MANUFACTURING WIRING CIRCUIT BOARDS WITH BUMPS AND METHOD FOR FORMING BUMPS

BACKGROUND OF THE INVENTION

1. Field of the Invention

The present invention relates to a method for manufacturing a wiring circuit board which has bumps of a constant fixed height.

2. Description of the Related Art

Very small bumps (e.g., 50 μm in diameter and 30 μm in height) are widely used in connections between electronic component elements such as semiconductor or LCD elements and wiring circuit boards, or between the different layers in multilayered wiring substrates.

A representative method for manufacturing bumps of such size is given in FIGS. 4A to 4E.

In other words, first, a dual-layer flexible substrate 43 comprising a copper foil 42 affixed to a polyimide film 41 is prepared, as shown in FIG. 4A, after which the copper foil 42 is patterned using a photolithography technique to form a wiring circuit 44 (FIG. 4B).

Next, a cover coat layer 45 is formed on the wiring circuit 44 in accordance with a conventional method (FIG. 4C). For example, it is possible to form the cover coat layer 45 by forming a polyamic acid layer on the wiring circuit 44, patterning it using photolithography and imidising it. A resist ink can also be printed thereon.

Next, very small bumps can be formed by irradiating with a laser light the region of the polyimide film 41 which corresponds to the wiring circuit 44 to form bump holes 46 (FIG. 4D), and then, using an electrolytic plating method to form metal bumps 47 on the wiring circuit 44, which is exposed in the bottom portion of the bump holes 46. The cover coat layer 45 may be optionally covered with a protective film (not shown) after the irradiation and before the electrolytic plating (FIG. 4E).

However, when the bump holes 46 are formed by the irradiation with the laser light, the surface area of the openings will vary, owing to scattering in the amount of smearing attached to the bottom portion of the bump holes 46; therefore a drawback arises in that substantial scattering appears in the height of the metal bumps 47. Accordingly, stable bump connections become difficult to achieve. Connecting semiconductor elements to the wiring circuit in one step using ultrasonic waves becomes particularly difficult. Plating pre-treatments become essential, moreover, in order to improve the adhesive strength between the wiring circuit 44 and the metal bumps 47 formed thereon.

SUMMARY OF THE INVENTION

In view of the foregoing problems of prior art, it is an object of the present invention to provide a method for manufacturing a wiring circuit board with bumps, which enables stable bump connections and furthermore does not require complex operations such as plating pre-treatments.

The inventors have perfected the present invention based on the discovery that stable bump connections can be effected by half-etching a metal foil, which is of a thickness that is the sum of the thickness corresponding to the height of the metal bumps and the thickness of the wiring circuit layer, to a depth corresponding to the thickness of the metal bumps, it is possible to fabricate bumps of uniform height, without requiring complex operations such as plating pre-treatments.

The present invention provides a method for the manufacture of a wiring circuit board having a wiring circuit and bumps formed thereon, comprising the steps of (a) laminating a protective film onto one surface of a metal foil on which bumps are to be formed, which is of a thickness that is the sum of the thickness of the wiring circuit and the height of bumps which are to be formed on the wiring circuit and forming a wiring circuit formation etching mask on the other surface of the metal foil where the wiring circuit is to be formed; (b) forming the wiring circuit to a desired thickness by half-etching the metal foil from the wiring circuit-formation etching mask side; (c) providing a cover coat layer on the wiring circuit, after removing the wiring circuit-formation etching mask; (d) forming a bump-formation etching mask on the bump formation surface, after removing the protective film which has been provided on the bump formation surface of the metal foil; (e) forming bumps to a desired height by half-etching the metal foil from the bump-formation etching mask side; (f) forming a polyimide precursor layer so as to bury the bumps, after removing the bump-formation etching mask; and (g) forming an insulating later of a desired thickness by etching back and then imidising the polyimide precursor layer. The wiring circuit can be formed before the bumps are formed, by using this method of manufacture.

Moreover, the present invention provides a method for the manufacture of a wiring circuit board having a wiring circuit and bumps formed thereon, comprising the steps of: (aa) laminating a protective film onto one surface of a metal foil on which a wiring circuit is to be formed, which is of a thickness that is the sum of the thickness of the wiring circuit and the height of bumps which are to be formed on the wiring circuit and forming a bump-formation etching mask on the other surface of the metal foil where the bumps are to be formed; (bb) forming the bumps to a desired height by half-etching the metal foil from the bump-formation etching mask side; (cc) forming a polyimide precursor layer so as to bury the bumps, after the bump-formation etching mask has been removed; (dd) forming an insulating layer of a desired thickness by etching and then imidising the polyimide precursor layer; (ee) forming a wiring circuit formation etching mask on the wiring circuit formation surface, after removing the protective film which has been provided on the wiring circuit formation surface of the metal foil; (ff) forming a wiring circuit to a desired thickness by half-etching the metal foil from the wiring circuit-formation etching mask side; and (gg) providing a cover coat layer on the wiring circuit, after removing the wiring circuit formation etching mask. Bumps can be formed before the wiring circuits are formed, by using this method of manufacture.

Moreover, the present invention provides a method for forming bumps, comprising forming a bump-formation etching mask on the bump formation surface of a metal foil of a thickness that is the sum of the thickness of the wiring circuit and the height of the bumps which are to be formed on the wiring circuit, and half-etching the metal foil to a depth corresponding to a desired bump height from the bump-formation etching mask side.

Furthermore, the present invention provides a wiring circuit board, comprising a wiring circuit, a cover coat layer formed on one surface of the wiring circuit, an insulating layer formed on the other surface of the wiring circuit, and bumps which are connected to the wiring circuit and formed so as to protrude from the insulating layer, wherein the wiring circuit and the bumps are formed from one metal foil. It is preferable to form a contact hole in the cover coat layer to enable electric connection to the wiring circuit from the cover coat layer side. The insulating layer is preferable to be a polyimide layer obtained by imidising a polyimide precursor.

DESCRIPTION OF THE PREFERRED EMBODIMENTS

The present invention will be described stepwise in further detail with reference to the drawings.

First, a method of manufacturing wiring circuit boards with bumps wherein bumps are formed on the wiring circuit shall be described stepwise with reference to FIG. 1, as a method of manufacture wherein wiring circuits are formed prior to bumps (Steps (a) through (g)).

Step (a)

Figure 1A:
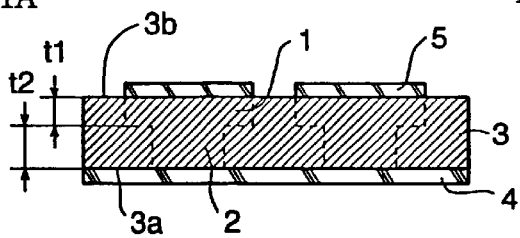
FIGS. 1A to 1G are process diagrams illustrating a method of manufacturing wiring circuit boards with bumps pertaining to the present invention.

First, a protective film 4 is laminated onto a bump-forming surface 3a of a metal foil 3, which is of a thickness that is the sum of the thickness t1 of a wiring circuit 1 (shown as a dotted line in the drawing) and the height t2 of bumps 2 (shown as a dotted line in the drawing) which are to be formed on the wiring circuit 1, and a wiring circuit-formation etching mask 5 is formed on a wiring circuit-formation surface 3b of the metal foil 3 (FIG. 1A).

A value which is maximally suited to the objective of application for the wiring circuit board is to be selected for the wiring circuit thickness t1 and the bump height t2. For example, the thickness t1 of the wiring circuit 1 can be set to 20 $\mu$m, the height t2 of the bumps 2 to 30 $\mu$m and the diameter of the bumps 2 to 50 $\mu$m when using wiring circuit boards as semiconductor element mounting substrates.

A material which is used in wiring circuit board conductor layers can be employed for the metal foil 3, with copper foil being preferred.

The wiring circuit-formation etching mask 5 can be formed by screen-printing a resist ink onto the wiring circuit formation surface 3b of the metal foil 3. Alternatively, the mask can be formed by providing a photosensitive resin layer or dry film thereon, then patterning it through exposure and development according to a conventional method.

Step (b)

Figure 1F:
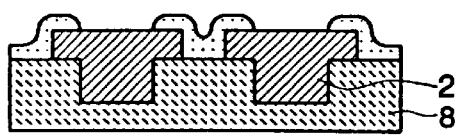
Figure 1B:
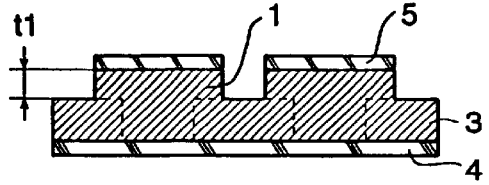

Next, the wiring circuit 1 of desired thickness t1 is formed by half-etching the metal foil 3 from the wiring circuit formation etching mask 5 side (FIG. 1B).

The half-etching conditions (temperature, etchant solution composition etc.) are to be suitably selected in accordance with material used for the metal foil 3, the thickness which should be removed by etching, etc.

Step (c)

Next, a cover coat layer 6 is provided on the wiring circuit 1, after the wiring circuit formation etching mask 5 has been removed using a conventional method (FIG. 1C) The cover coat layer 6 can be formed by screen-printing a cover coat layer coating thereon. Alternatively, a photosensitive resin layer or dry film can be provided thereon and then patterned by exposure and development according to a conventional method. Moreover, a layer comprising polyamic acid or another polyimide precursor can be provided thereon, then patterned and imidised.

Step (d)

Figure 1G:
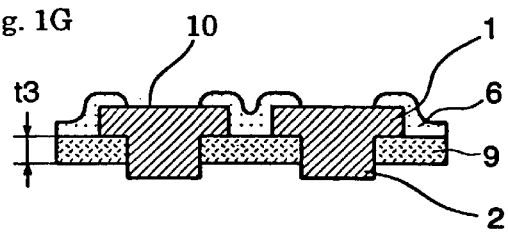
Figure 1C:
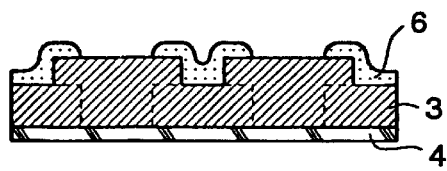
Figure 1D:
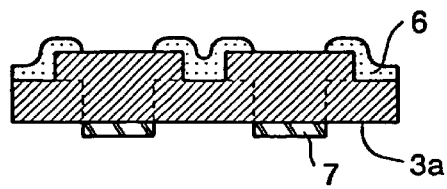

A bump-formation etching mask 7 is formed on the bump-forming surface 3a after the protective film 4, which has been provided on the bump-forming surface 3a of the metal foil 3, has been removed according to a conventional method (FIG. 1D).

The bump-formation etching mask 7 can be formed by screen-printing a resist ink on the bump-forming surface 3a of the metal foil 3. Alternatively, a photosensitive resin layer or dry film can be provided thereon and then patterned by exposure and development according to a conventional method.

Step (e)

Figure 1E:
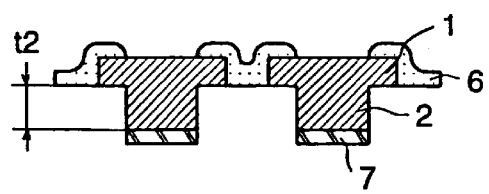

Bumps 2 of desired height t2 are formed by half-etching the metal foil 3 from the bump-formation etching mask 7 side (FIG. 1E).

The half-etching conditions (temperature, etching solution composition etc.) are to be suitably selected in accordance with the material used for the metal foil 3, the thickness which should be removed by etching, etc.

The cover coat layer 6 may be covered by a protective film prior to the half-etching (not shown).

Step (f)

A polyimide precursor layer 8 is formed so as to bury the bumps 2, after the bump-formation etching mask 7 has been removed according to a conventional method (FIG. 1F).

When the bump-formation etching mask 7 is to be removed, the protective film may be removed at the same time, should the cover coat layer 6 be covered by the film.

Moreover, the polyimide precursor layer 8 can be provided by forming a film from polyamic acid etc. according to a conventional method. The conditions for imidisation can be determined according to the type of polyimide precursor employed.

Step (g)

The polyimide precursor layer 8 is etched back and imidised to form a insulating layer 9 of the desired thickness t3. The wiring circuit board with bumps of the present invention as shown in FIG. 1G can be thereby obtained. This wiring circuit board comprises the wiring circuit 1, the cover coat layer 6 formed on one surface of the wiring circuit 1, the insulating layer 9 formed on the other surface of the wiring circuit 1, and bumps 2 which are connected to the wiring circuit 1 and formed so as to protrude from the insulating layer 9. A significant feature of the wiring circuit board of the present invention resides in that the wiring circuit and the bumps are formed from one metal foil. It is preferred that contact holes 10 are formed in the cover coat layer 6 to enable electric connection to the wiring circuit 1 from the cover coat layer side. The insulating layer 9 is preferable to be a polyimide layer obtained by imidising a polyimide precursor.

Next, a method of manufacturing wiring circuit boards with bumps wherein bumps are formed on the wiring circuit shall be described stepwise with reference to FIG. 2, as a method of manufacture wherein the bumps are formed prior to the wiring circuits (Steps (aa) through (gg)). The structural elements indicated by the symbols in FIGS. 2A to 2G correspond to the structural elements of the same symbols in FIGS. 1A to 1G.

Step (aa)

Figure 2A:
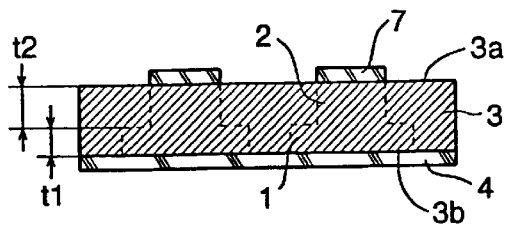
FIGS. 2A to 2G are process diagrams illustrating a method of manufacturing wiring circuit boards with bumps pertaining to the present invention.

First, a protective film 4 is laminated onto a wiring circuit formation surface 3b of a metal foil 3, which is of a thickness that is the sum of the thickness t1 of the wiring circuit 1 (shown as a dotted line in the drawing) and the height t2 of bumps 2 (shown as a dotted line in the drawing) which are to be formed on the wiring circuit 1, and a bump-formation etching mask 7 is formed on a bump-forming surface 3a of the metal foil 3 (FIG. 2A).

Step (bb)

Figure 2F:
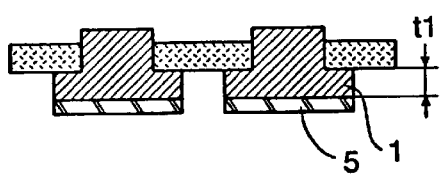
Figure 2B:
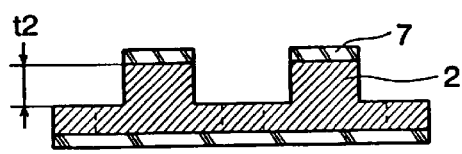
Figure 2G:
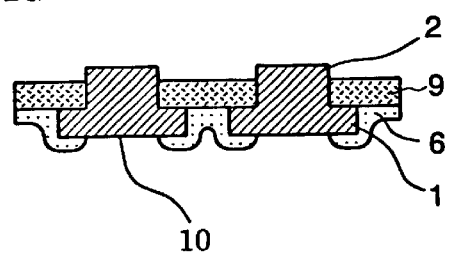

The bumps 2 of desired height t2 are formed by half-etching the metal foil 3 from the bump-formation etching mask 7 side (FIG. 2B).

Step (cc)

Figure 2C:
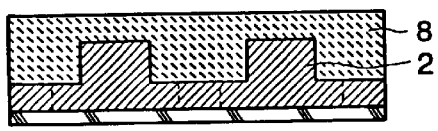

A polyimide precursor layer 8 is formed so as to bury the bumps 2, after the bump-formation etching mask 7 has been removed according to a conventional method (FIG. 2C).

Step (dd)

Figure 2D:
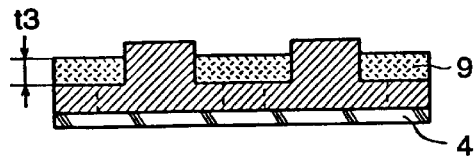

The polyimide precursor layer 8 is etched back and imidised to form a insulating layer 9 of the desired thickness t3 (FIG. 2D).

Step (ee)

Figure 2E:
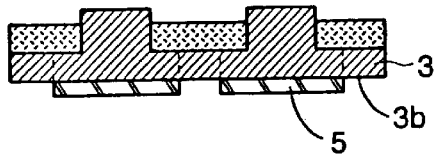

The wiring circuit formation etching mask 5 is formed on the wiring circuit formation surface 3b, after the protective film 4 which has been provided on the wiring circuit formation surface 3b of the metal foil 3 has been removed according to a conventional method (FIG. 2E).

Step (ff)

Wiring circuits 1 of desired thickness t1 are formed by half-etching the metal foil 3 from the wiring circuit formation etching mask 5 side (FIG. 2F).

The bumps 2 may be covered by a protective film prior to the half-etching (not shown).

Step (gg)

The cover coat layer 6 is provided the wiring circuit 1, after the wiring circuit formation etching mask 5 has been removed according to a conventional method. The wiring circuit board with bumps shown in FIG. 2G, which has the same structure as that of wiring circuit board as shown in FIG. 1G, can be thereby obtained.

When the wiring circuit formation etching mask 5 is to be removed, the protective film may be removed at the same time, should the bumps 2 be covered by the film.

Figure 3A:
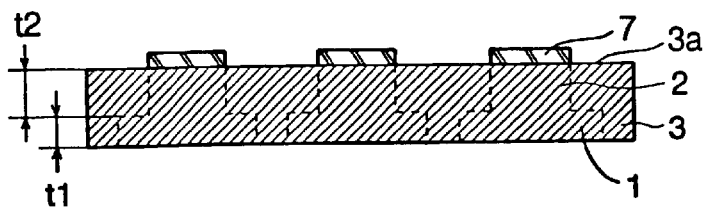
FIGS. 3A and 3B are process diagrams illustrating a method for forming bumps.
Figure 3B:
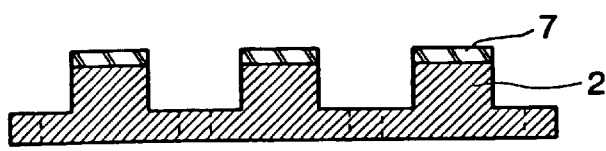
Figure 4A:
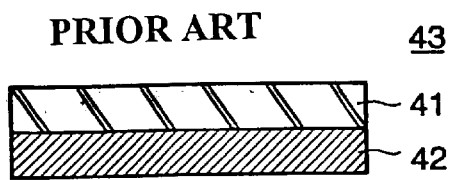
FIGS. 4A to 4E are process diagrams illustrating a conventional method of manufacturing wiring circuit boards with bumps.
Figure 4D:
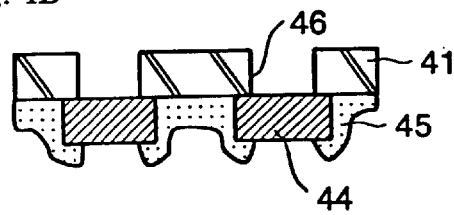
Figure 4B:
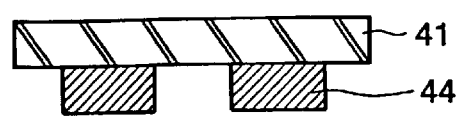
Figure 4E:
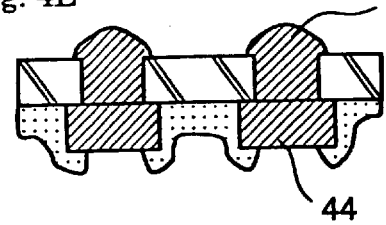
Figure 4C:
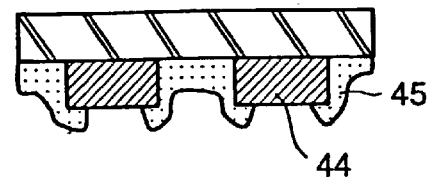

If the methods of manufacturing wiring circuit boards with bumps as described in FIGS. 1A to 1G and FIGS. 2A to 2G are viewed from the perspective of being methods for forming bumps, then the method for forming bumps as depicted by FIGS. 3A and 3B can be educed.

In other words, a bump-formation etching mask 7 is formed on the bump-forming surface 3a of the metal foil 3 which has a thickness that is the sum of the thickness t1 of the wiring circuit 1 and the height t2 of the bumps 2 which are to be formed on the wiring circuit 1 (t1+t2) (FIG. 3A), and then, as shown in FIG. 3B, the bumps 2 can be formed by half-etching the metal foil 3 to a depth corresponding to the desired bump height t2 from the bump-formation etching mask 7 side. In such a case, it is allowable for the wiring circuit 1 to be worked after the forming of bumps 2, and it is also allowable for the bumps 2 to be formed after the wiring circuit 1 has been worked.

The height of the bumps thereby obtained is kept uniform and the combined thickness of the wiring circuit and the bumps is also kept constant. Stable bump connections are thereby made possible.

According to the present invention, wiring circuit boards with bumps can be provided wherein the bump strength is stable, stable bump connections are possible and plating pre-treatments or other complex processes are rendered unnecessary. The bump connections in integrated circuits in particular can be made stably, in one step, using ultrasonic waves.

The entire disclosure of the specification, claims and drawings of Japanese Patent Application No. 11-319669 filed on Nov. 10, 1999 is hereby incorporated by reference.

What is claimed is:

1. A method for the manufacture of a wiring circuit board having a wiring circuit and bumps formed thereon, comprising the steps of:

(a) laminating a protective film onto one surface of a metal foil on which bumps are to be formed, which is of a thickness that is the sum of the thickness of the wiring circuit and the height of bumps which are to be formed on the wiring circuit and forming a wiring circuit formation etching mask on the other surface of the metal foil where the wiring circuit is to be formed;

(b) forming the wiring circuit to a desired thickness by half-etching the metal foil from the wiring circuit-formation etching mask side;

(c) providing a cover coat layer on the wiring circuit, after removing the wiring circuit-formation etching mask;

(d) forming a bump-formation etching mask on the bump formation surface, after removing the protective film which has been provided on the bump formation surface of the metal foil;

(e) forming bumps to a desired height by half-etching the metal foil from the bump-formation etching mask side;

(f) forming a polyimide precursor layer so as to "bury" the bumps, after removing the bump-formation etching mask; and (g) forming an insulating layer of a desired thickness by etching back and then imidizing the polyimide precursor layer.

2. A method for the manufacture of a wiring circuit board having a wiring circuit and bumps formed thereon, comprising the steps of:

(aa) laminating a protective film onto one surface of a metal foil on which a wiring circuit is to be formed, which is of a thickness that is the sum of the thickness of the wiring circuit and the height of bumps which are to be formed on the wiring circuit and forming a bump-formation etching mask on the other surface of the metal foil where the bumps are to be formed;

(bb) forming the bumps to a desired height by half-etching the metal foil from the bump-formation etching mask side;

(cc) forming a polyimide precursor layer so as to bury the bumps, after the bump-formation etching mask has been removed;

(dd) forming an insulating layer of a desired thickness by etching and then imidizing the polyimide precursor layer;

(ee) forming a wiring circuit formation etching mask on the wiring circuit formation surface, after removing the protective film which has been provided on the wiring circuit formation surface of the metal foil;

(ff) forming wiring circuits to a desired thickness by half-etching the metal foil from the wiring circuit-formation etching mask side; and (gg) providing a cover coat layer on the wiring circuit, after removing the wiring circuit formation etching mask.

3. A method for the manufacture of a wiring circuit board having a wiring circuit and bumps formed thereon, comprising the steps of:

(a) laminating a protective film onto one surface of a metal foil on which bumps are to be formed, which is of a thickness that is the sum of the thickness of the wiring circuit and the height of bumps which are to be formed on the wiring circuit and forming a wiring circuit formation etching mask on the other surface of the metal foil where the wiring circuit is to be formed;

(b) forming the wiring circuit to a desired thickness by half-etching the metal foil from the wiring circuit-formation etching mask side;

(c) providing a cover coat layer on the wiring circuit, after removing the wiring circuit-formation etching mask;

(d) forming a bump-formation etching mask on the bump formation surface after removing the protective film of a metal foil of a thickness that is the sum of a thickness of the wiring circuit and the height of the bumps which are to be formed on the wiring circuit, and half-etching the metal foil to a depth corresponding to a desired bump height from the bump-formation etching mask side;

(e) forming a polyimide precursor layer so as to "bury" the bumps, after removing the bump-formation etching mask; and (f) forming an insulating layer of a desired thickness by etching back and then imidizing the polyimide precursor layer.

* * * * *